(12) United States Patent
Vellanki et al.

(10) Patent No.: US 11,035,894 B2
(45) Date of Patent: *Jun. 15, 2021

(54) REDUCING NOISE IN A CAPACITIVE SENSOR WITH A PULSE DENSITY MODULATOR

(71) Applicant: Cirrus Logic International Semiconductor Ltd., Edinburgh (GB)

(72) Inventors: Amar Vellanki, Austin, TX (US); Zhong You, Austin, TX (US); Johann G. Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/890,727

(22) Filed: Jun. 2, 2020

(65) Prior Publication Data

US 2020/0292602 A1  Sep. 17, 2020

Related U.S. Application Data

(63) Continuation of application No. 15/926,734, filed on Mar. 20, 2018, now Pat. No. 10,718,801.

(60) Provisional application No. 62/548,197, filed on Aug. 21, 2017.

(51) Int. Cl.
*G01R 27/26* (2006.01)
*H04R 29/00* (2006.01)
*H04R 3/00* (2006.01)

(52) U.S. Cl.
CPC ....... *G01R 27/2605* (2013.01); *H04R 29/001* (2013.01); *H04R 3/002* (2013.01)

(58) Field of Classification Search
CPC ........ G01D 5/24; G01D 5/241; G01D 5/2417; G01R 19/25; G01R 27/26; G01R 27/2605; G01R 9/26; H04L 27/144; H04R 29/001; H04R 2201/003; H03F 2200/345; H03F 2200/351
See application file for complete search history.

(56) References Cited

U.S. PATENT DOCUMENTS

| 5,563,535 A * | 10/1996 | Corry .................... G06F 1/0328 327/105 |
| 5,952,947 A | 9/1999 | Nussbaum |
| 6,429,797 B1 * | 8/2002 | Wu .................... H03H 17/0621 341/143 |
| 6,433,643 B1 * | 8/2002 | Opsahl .................. H03L 7/1976 331/1 A |
| 6,831,577 B1 | 12/2004 | Furst |

(Continued)

*Primary Examiner* — Steven L Yeninas
(74) *Attorney, Agent, or Firm* — Jackson Walker L.L.P.

(57) ABSTRACT

A method for measuring a capacitive sensor output may include applying an excitation signal to a capacitor of the capacitive sensor which causes generation of a modulated signal from a baseband signal, wherein the excitation signal is of a carrier frequency which is higher than frequency content of the baseband signal, demodulating the modulated signal to generate an intermediate signal representative of a capacitance of the capacitor wherein the demodulating is based, at least in part, on the excitation signal, converting the intermediate signal into a pulse-density modulated output signal with a pulse-density modulator, and shaping a noise transfer function of the pulse-density modulator to have an approximate zero at the carrier frequency.

10 Claims, 2 Drawing Sheets

(56) References Cited

U.S. PATENT DOCUMENTS

| | | | |
|---|---|---|---|
| 7,479,910 B1* | 1/2009 | Heinks | A61N 1/3704 341/118 |
| 8,520,881 B2* | 8/2013 | Nikles | H04R 25/353 381/370 |
| 8,742,964 B2 | 6/2014 | Kleks et al. | |
| 9,478,231 B1 | 10/2016 | Soman | |
| 10,015,037 B2 | 7/2018 | Boos et al. | |
| 10,581,453 B1 | 3/2020 | Ganta et al. | |
| 2006/0012500 A1* | 1/2006 | Melanson | H03M 3/366 341/143 |
| 2006/0273805 A1 | 12/2006 | Peng et al. | |
| 2009/0079606 A1* | 3/2009 | Terry | H03M 3/434 341/143 |
| 2013/0223651 A1 | 8/2013 | Hoyerby | |
| 2013/0308797 A1 | 11/2013 | Phelps et al. | |
| 2014/0133677 A1 | 5/2014 | Zerbini et al. | |
| 2014/0177874 A1 | 6/2014 | Bogason et al. | |
| 2015/0237432 A1 | 8/2015 | Miluzzi et al. | |
| 2015/0281836 A1 | 10/2015 | Nguyen et al. | |
| 2015/0350760 A1 | 12/2015 | Nandy et al. | |
| 2016/0065177 A1 | 3/2016 | Chappaz | |
| 2016/0171966 A1 | 6/2016 | Molinari et al. | |
| 2016/0192084 A1 | 6/2016 | Oliaei | |
| 2017/0040902 A1 | 2/2017 | Laturell et al. | |
| 2017/0180856 A1 | 6/2017 | Mehta et al. | |
| 2017/0230750 A1 | 8/2017 | Pawlowski et al. | |
| 2017/0245063 A1 | 8/2017 | Jensen | |
| 2017/0251303 A1 | 8/2017 | Lesso et al. | |
| 2017/0295429 A1 | 10/2017 | Poletti | |
| 2018/0014123 A1 | 1/2018 | Shajaan et al. | |
| 2018/0027338 A1 | 1/2018 | Shajaan et al. | |
| 2018/0063638 A1 | 3/2018 | Bini et al. | |
| 2018/0138882 A1 | 5/2018 | Kim et al. | |
| 2018/0295454 A1 | 10/2018 | Kasai et al. | |
| 2019/0149165 A1 | 5/2019 | Finck et al. | |
| 2019/0261085 A1 | 8/2019 | Lesso et al. | |

* cited by examiner

US 11,035,894 B2

REDUCING NOISE IN A CAPACITIVE SENSOR WITH A PULSE DENSITY MODULATOR

CROSS-REFERENCE AND RELATED APPLICATIONS

The present disclosure is a continuation of U.S. Non-Provisional patent application Ser. No. 15/926,734, filed Mar. 20, 2018, which claims benefit of U.S. Provisional Patent Application Ser. No. 62/548,197, filed Aug. 21, 2017, each of which is incorporated by reference herein in its entirety.

FIELD OF DISCLOSURE

The present disclosure relates in general to measuring capacitance, and more specifically, to systems and methods for measuring capacitance using a capacitance to voltage converter in a noisy environment.

BACKGROUND

In many electrical and electronic systems, it may be desirable to measure a capacitance within a circuit in order to take action responsive to the measured capacitance. For example, a capacitive sensor used in an audio speaker may be used to sense a position of a transducer diaphragm of the audio speaker. The capacitance value of a capacitive sensor which changes responsive to an audio signal driven through the speaker may be measured by driving a carrier tone on one terminal of the speaker and sensing a modulated signal current on the other terminal.

One type of apparatus for measuring capacitance is known as a capacitance-to-digital converter, or "CDC," which is capable of measuring a capacitance and generating a digital output signal indicative of a magnitude of the measured capacitance. A CDC-based capacitive sensor may operate in a noisy environment which can affect measurement sensitivity of a measurement, and thus, systems and methods for reducing or eliminating such noise may be desirable. For example, in some applications, an integrated circuit output pin carrying a pulse-density modulated signal representative of a capacitance measurement may couple noise into the capacitor being measured, reducing measurement accuracy and sensitivity.

SUMMARY

In accordance with the teachings of the present disclosure, certain disadvantages and problems associated with performance of existing capacitance-to-digital converters have been reduced or eliminated.

In accordance with embodiments of the present disclosure, a method for measuring a capacitive sensor output may include applying an excitation signal to a capacitor of the capacitive sensor which causes generation of a modulated signal from a baseband signal, wherein the excitation signal is of a carrier frequency which is higher than frequency content of the baseband signal, demodulating the modulated signal to generate an intermediate signal representative of a capacitance of the capacitor wherein the demodulating is based, at least in part, on the excitation signal, converting the intermediate signal into a pulse-density modulated output signal with a pulse-density modulator, and shaping a noise transfer function of the pulse-density modulator to have an approximate zero at the carrier frequency.

In accordance with these and other embodiments of the present disclosure, an apparatus for measuring a capacitive sensor output may include an excitation source configured to apply an excitation signal to a capacitor of the capacitive sensor which causes generation of a modulated signal from a baseband signal, wherein the excitation signal is of a carrier frequency which is higher than frequency content of the baseband signal, a demodulator configured to demodulate the modulated signal to generate an intermediate signal representative of a capacitance of the capacitor wherein the demodulator is configured to demodulate based, at least in part, on the excitation signal, and a pulse density modulator configured to convert the intermediate signal into a pulse-density modulated output signal with a pulse-density modulator and shape a noise transfer function of the pulse-density modulator to have an approximate zero at the carrier frequency.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
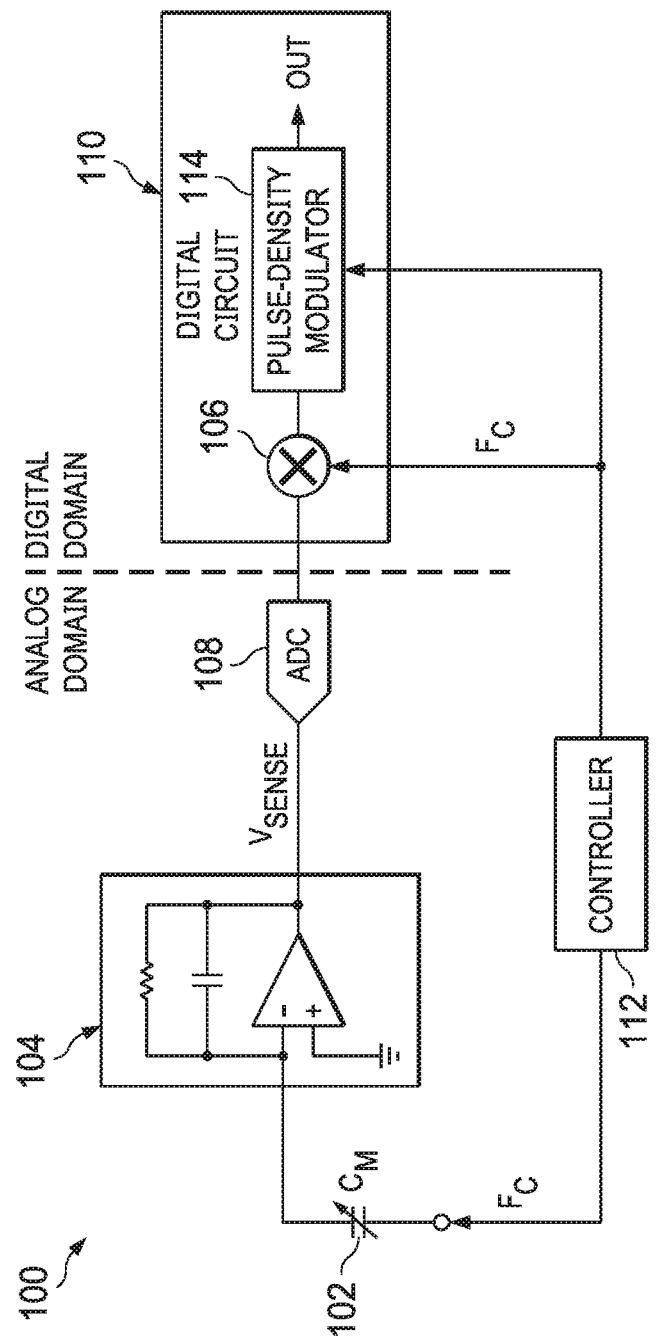
FIG. 1 is a block diagram of selected components of an example capacitance-sensing circuit, in accordance with embodiments of the present disclosure.

FIG. 1 is a block diagram of selected components of an example capacitance-sensing circuit 100 for sensing a variable capacitance $C_M$ of a component 102, wherein carrier demodulation is implemented in a digital domain, in accordance with embodiments of the present disclosure. In some embodiments, component 102 may comprise an audio speaker and capacitance $C_M$ may be representative of a displacement of an audio transducer of such audio speaker. However, the systems and methods disclosed herein are not limited to measuring displacement in an audio speaker, and may be applied to any suitable measuring or sensing of a capacitance.

As shown in FIG. 1, capacitance sensing circuit 100 may include a capacitance-to-voltage converter (CVC) 104, an analog-to-digital converter (ADC) 108, digital circuitry 110, and a controller 112. CVC 104 may comprise a charge integrator configured to integrate charge at its input to generate a voltage signal $V_{SENSE}$ indicative of capacitance $C_M$ of component 102. Such voltage signal $V_{SENSE}$ may be generated by applying an excitation signal at a carrier frequency $f_C$ to one of the terminals of capacitance $C_M$ of component 102, which may cause generation of a modulated voltage signal $V_{SENSE}$ from a baseband signal indicative of capacitance $C_M$, wherein the excitation signal is of a carrier frequency $f_C$ which is higher than frequency content of the baseband signal.

ADC 108 may convert modulated voltage signal $V_{SENSE}$ into an equivalent modulated digital signal that may be further processed by digital circuitry 110. As shown in FIG. 1, ADC 108 may define a boundary between an analog domain of a signal path of capacitance sensing circuit 100 and a digital domain of the signal path of capacitance sensing circuit 100.

As also depicted in FIG. 1, digital circuitry 110 may include a demodulator 106 and a pulse-density modulator 114. Demodulator 106 may demodulate the modulated digital signal from ADC 108 at the carrier frequency $f_C$ in a digital domain of capacitance sensing circuit 100 to generate a digital signal representative of a capacitance of the capacitor wherein the demodulating is based, at least in part, on the excitation signal. For example, the demodulation signal received by demodulator 106 may comprise a sine wave at carrier frequency $f_C$. Pulse-density modulator 114 may comprise any system, device, or apparatus configured to receive the digital signal output by demodulator 106 and modulate such signal to create an equivalent pulse-density modulated signal OUT, such that pulse-density modulated signal OUT is representative of capacitance $C_M$ of component 102.

Controller 112 may be configured to apply the excitation signal to one of the terminals of capacitance $C_M$ of component 102 as described above. In some embodiments, such excitation signal may comprise a square-wave signal. Controller 112 may also be configured to generate a digital equivalent of the excitation signal (e.g., a sine wave at carrier frequency $f_C$) to demodulator 106 such that demodulator 106 demodulates the modulated digital signal generated by ADC 108 as described above.

Further, pulse-density modulator 114 may have a noise transfer function, and controller 112 may be configured to control the noise transfer function (e.g., by communicating one or more appropriate control signals) of pulse-density modulator 114 in order to shape the noise transfer function of pulse-density modulator 114 to have an approximate zero at carrier frequency $f_C$, in order to reduce or eliminate coupling of noise from the output of pulse-density modulator 114 to the capacitor of component 102. In some embodiments, pulse-density modulator 114 may be able to vary the approximate zero of the noise transfer function of pulse-density modulator 114 responsive to changes in carrier frequency $f_C$. For example, in some embodiments, such changes in carrier frequency $f_C$ may occur in order to reduce noise or interference at a certain frequency from appearing in the modulated signal.

Figure 2:
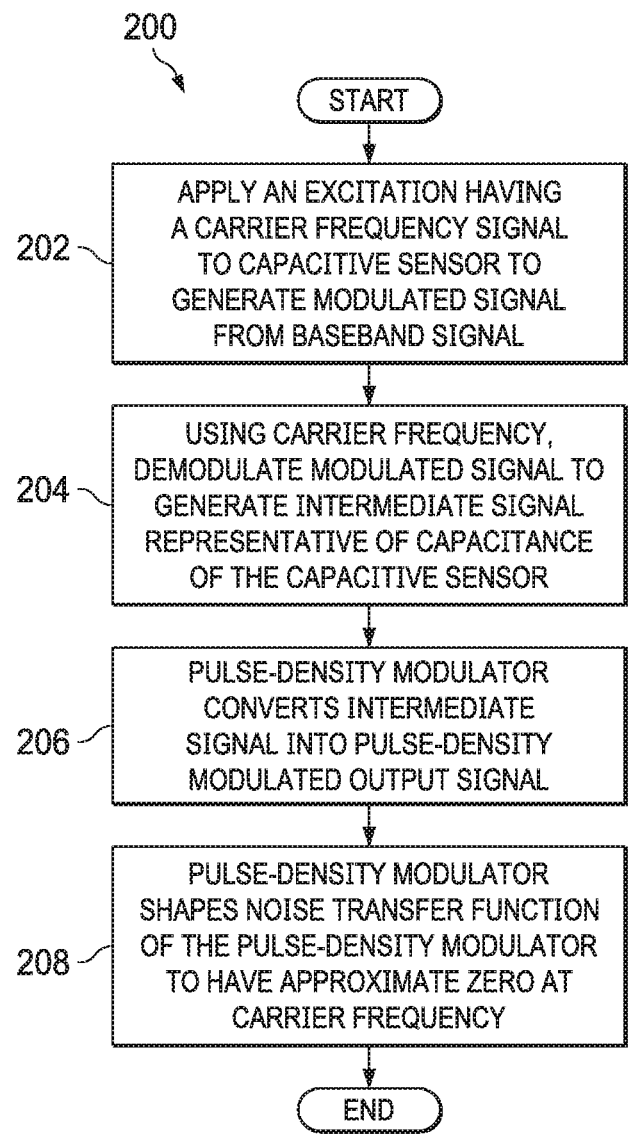
FIG. 2 is a flow chart of an example method for reducing noise in a capacitive sensor having a pulse-density modulator, in accordance with embodiments of the present disclosure.

FIG. 2 is a flow chart of an example method 200 for reducing noise in a capacitive sensor having a pulse-density modulator, in accordance with embodiments of the present disclosure. According to certain embodiments, method 200 may begin at step 202. As noted above, teachings of the present disclosure may be implemented in a variety of configurations of a capacitive sensing circuit. As such, the preferred initialization point for method 200 and the order of the steps comprising method 200 may depend on the implementation chosen. In these and other embodiments, method 200 may be implemented as firmware, software, applications, functions, libraries, or other instructions.

At step 202, a signal generator (e.g., controller 112) may apply an excitation signal to a capacitor of a capacitive sensor (e.g., component 102) which causes generation of a modulated signal from a baseband signal, wherein the excitation signal is of a carrier frequency (e.g., carrier frequency $f_C$) which is higher than frequency content of the baseband signal. At step 204, a demodulator (e.g., demodulator 106) may demodulate the modulated signal to generate an intermediate digital signal representative of a capacitance of the capacitor wherein the demodulating is based, at least in part, on the excitation signal (e.g., at carrier frequency $f_C$). In some embodiments, the modulated signal may comprise a digital signal and demodulating the modulated signal may comprise demodulating the modulated signal in a digital domain.

At step 206, a pulse-density modulator (e.g., pulse-density modulator 114) may convert the intermediate signal into a pulse-density modulated output signal (e.g., pulse-density modulated output signal OUT). In some embodiments, the pulse-density modulated output signal may be a one-bit signal.

At step 208, the pulse-density modulator, alone or in concert with an appropriate controller (e.g., controller 112), may shape a noise transfer function of the pulse-density modulator to have an approximate zero at the carrier frequency. In some embodiments, the approximate zero may vary in accordance with variances or changes of the carrier frequency.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented in whole or part using capacitance sensing circuit 100, components thereof or any other system operable to implement method 200. In certain embodiments, method 200 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method for measuring a capacitive sensor output, comprising:
   demodulating a modulated signal to generate an intermediate signal representative of a capacitance of a capacitor of the capacitive sensor wherein the demodulating is based, at least in part, on an excitation signal applied to the capacitor of the capacitive sensor which causes generation of a modulated signal from a baseband signal, wherein the excitation signal is of a carrier frequency which is higher than frequency content of the baseband signal;
   converting the intermediate signal into a pulse-density modulated output signal with a pulse-density modulator; and
   shaping a noise transfer function of the pulse-density modulator to have an approximate zero at the carrier frequency.

2. The method of claim 1, wherein the pulse-density modulated output signal is a one-bit signal.

3. The method of claim 1, further comprising varying a frequency of the zero based on the carrier frequency.

4. The method of claim 1, wherein the capacitance is representative of a displacement of a transducer.

5. The method of claim 4, wherein the transducer comprises one of a speaker, a linear resonant actuator, and a haptic transducer.

6. An apparatus for measuring a capacitive sensor output, comprising:
   a demodulator configured to demodulate a modulated signal to generate an intermediate signal representative of a capacitance of a capacitor of the capacitive sensor wherein the demodulator is configured to demodulate based, at least in part, on an excitation signal applied to the capacitor of the capacitive sensor which causes generation of a modulated signal from a baseband signal, wherein the excitation signal is of a carrier frequency which is higher than frequency content of the baseband signal; and
   a pulse density modulator configured to:
      convert the intermediate signal into a pulse-density modulated output signal with a pulse-density modulator; and
      shape a noise transfer function of the pulse-density modulator to have an approximate zero at the carrier frequency.

7. The apparatus of claim 6, wherein the pulse-density modulated output signal is a one-bit signal.

8. The apparatus of claim 6, further comprising varying a frequency of the zero based on the carrier frequency.

9. The apparatus of claim 6, wherein the capacitance is representative of a displacement of a transducer.

10. The apparatus of claim 9, wherein the transducer comprises one of a speaker, a linear resonant actuator, and a haptic transducer.

* * * * *